United States Patent [19]

Broussoux et al.

[11] Patent Number: 4,670,074

[45] Date of Patent: Jun. 2, 1987

[54] PIEZOELECTRIC POLYMER TRANSDUCER AND PROCESS OF MANUFACTURING THE SAME

[75] Inventors: Dominique Broussoux; Hugues Facoetti; Francois Micheron, all of Paris, France

[73] Assignee: Thomson-CSF, France

[21] Appl. No.: 788,100

[22] Filed: Oct. 16, 1985

Related U.S. Application Data

[60] Continuation of Ser. No. 634,662, Jul. 26, 1984, abandoned, which is a division of Ser. No. 426,755, Sep. 29, 1982, abandoned.

[30] Foreign Application Priority Data

Dec. 31, 1981 [FR] France .............................. 81 24564

[51] Int. Cl.⁴ .............................................. B29C 47/00
[52] U.S. Cl. .................................. 156/198; 156/244.14; 156/244.24; 156/244.27; 156/274.6; 53/451; 29/25.35
[58] Field of Search ....................................... 29/25–35; 156/194, 198, 229, 244.14, 244.27, 244.12, 272.2, 274.6, 274.4, 244.24; 53/451

[56] References Cited

U.S. PATENT DOCUMENTS

Re. 27,116  4/1971  Miller et al. ...................... 29/25.35
2,388,242  11/1945  Arndt ................................ 186/273.9
2,423,922  7/1947  Arndt ................................ 156/273.9
2,510,078  6/1950  Compton ........................... 156/308.6
3,053,609  9/1962  Miller ............................... 156/308.6
3,322,588  5/1967  Schelhorn ........................ 156/244.14
3,449,094  6/1969  Baxt et al. ......................... 429/416
4,057,660  11/1977  Yoshida ............................ 427/271
4,172,319  10/1979  Bloom .............................. 427/419.5
4,288,965  9/1981  James ................................. 53/451
4,302,408  11/1981  Ichichara .......................... 427/100
4,317,321  3/1982  Torterotot ......................... 53/451
4,327,153  4/1982  Micheron ......................... 428/260
4,427,609  1/1984  Broussoux ......................... 264/22

FOREIGN PATENT DOCUMENTS 0013952  1/1980  Fed. Rep. of Germany .
2042256  9/1980  United Kingdom .

Primary Examiner—Donald E. Czaja
Assistant Examiner—Merrell C. Cashion, Jr.
Attorney, Agent, or Firm—Cushman, Darby & Cushman

[57] ABSTRACT

A composite co-laminated piezoelectric transducer with at least one layer of polymeric substance capable of acquiring piezoelectric properties when co-laminated in the presence of an electrical field, the layer being adjacent to a conductive material acting as an electrode. According to the invention the conductive material is a polymeric substance.

12 Claims, 11 Drawing Figures

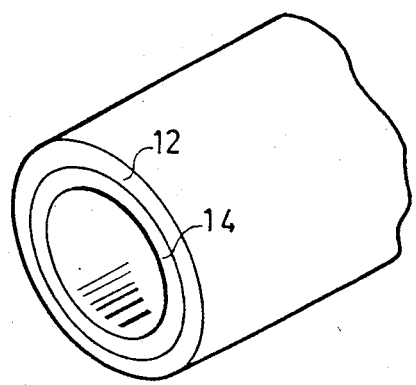
FIG. 5
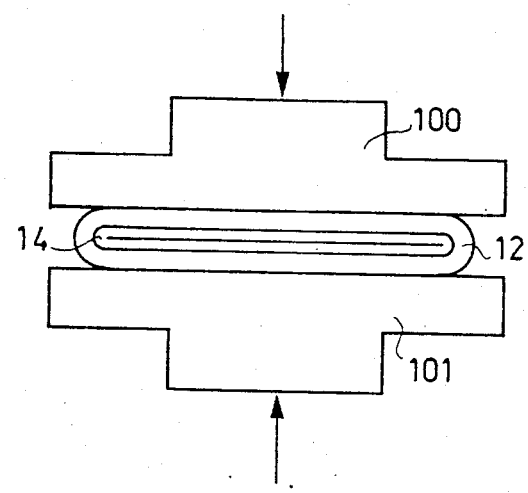
FIG. 6
FIG. 7
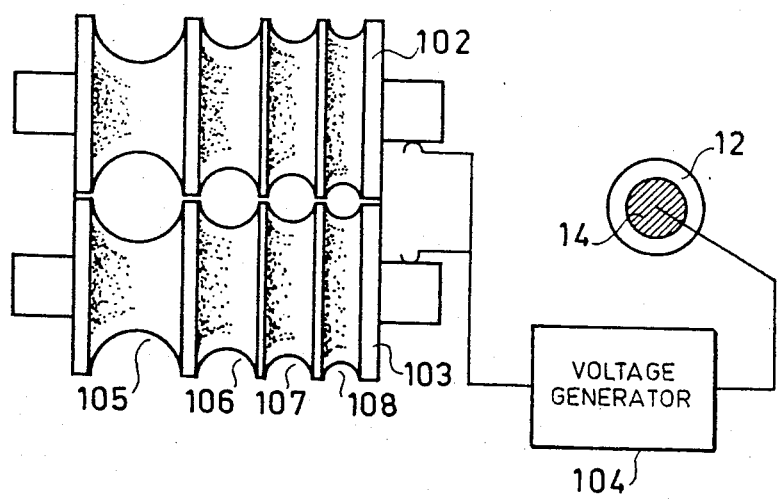

PIEZOELECTRIC POLYMER TRANSDUCER AND PROCESS OF MANUFACTURING THE SAME

This is a continuation of application Ser. No. 634,662, filed July 26, 1984, which was abandoned upon the filing hereof and which was a divisional of Ser. No. 426,755, filed Sept. 29, 1982, now abandoned.

BACKGROUND OF THE INVENTION.

The present invention is related to an electromechanical transducer using piezoelectric polymeric substances. It is also related to a process for manufacturing such transducer.

The piezoelectric effect generated by this type of transducer is due to flexion when the transducer structure considered is a bimorph structure.

The polymeric substances used in transducers allow flexional deformations or deformations of the elongation-compression type of the transducer. Such transducers are polarized by passing through a rolling mill in the presence of an electric field. The instant invention is particularly related to transducer bodies obtained by conjointly rolling (co-laminating) two layers of polymeric substance, said layers being welded, or bonded, to each other by means of a polymeric substance which is rendered conductive by a convenient ingredient.

According to a known method, at least two superimposed polymer layers are rolled, which layers do not adhere to each other at the end of this operation. According to this technique, the intermediary electrode required for effecting the polarization is a fluid electrode. In this case a conductive bonding agent may be added after the rolling operation, so as to produce a usable intermediary electrode and a monolithic structure. When such operation is performed after rolling in the presence of an electric field, certain piezoelectric properties of the polymers will be impaired on account of the pressure which must be applied at elevated temperature with a view to obtaining efficient bonding.

When it is desired to privilege, or promote, the piezoelectric coefficients perpendicularly to the flexional axis, it is preferred to use so-called "mono-drawn" piezoelectric blades. According to one known method, the manufacturing of transducers of this type consists in co-laminating (i.e., co-jointly rolling) at least two polymer blades while polarizing the same, the rolling cylinders (or rollers) acting as electrodes for applying the electric polarizing field.

When it is desired to obtain mutually opposed remanent polarizations it is advantageous to apply the voltage required for creating the electric field between the intermediary electrode and the ground potential, in which case the rolling cylinders are connected to the ground.

When carrying out the rolling operation the most exacting problem resides in effecting this operation in such a manner that the intermediary electrode retains its electric properties in spite of the stresses to which it is submitted by the action of the rolling cylinders. Indeed the forces exerted by said cylinders range from 40 to 100 tons; the drawing or stretching ratio may reach values as high as 3 or 4, and consequently rupturing may occur in the mass of the electrode. Another problem is raised by the adherence obtained by bonding (gluing) the polymer blades to the intermediary electrode, since the expansion coefficients of the materials constituting the transducer are substantially different from each other.

With a view to overcoming these drawbacks the present invention aims, inter alia, at providing an intermediary electrode made of a polymeric substance rendered conductive by incorporating therein a convenient material which is easily integrated in the mass of said substance. This polymeric substance acts as a central (or intermediary) electrode as well as an adhesive between two blades of the transducer.

SUMMARY OF THE INVENTION

It is thus an object of the invention to provide a co-laminated piezoelectric transducer having a composite structure which comprises at least one layer of a polymeric substance adapted to acquire piezoelectric properties by co-lamination in the presence of an electric field, said layer being adjacent to a conductive material acting as an electrode, wherein said conductive material is a polymeric substance.

Another object of the invention is to provide a process of manufacturing a piezoelectric transducer having a composite structure which comprises at least one layer of polymeric substance adapted to acquire piezoelectric properties by co-lamination in the presence of an electric field, said layer being adjacent to a conductive material acting as an electrode, said process comprising the steps of producing a monolithic pre-shaped piece or structure, wherein said conductive material is a conductive polymer adhering to said layer, and then rolling said pre-shaped piece within an electric field.

Other objects, features, and advantages of the invention will become apparent from the following description which refers to the appended drawings, and which is given by way of illustration, but not of limitation.

BRIEF DESCRIPTION OF THE DRAWINGS

FIG. 5 shows a tubular pre-shaped piece with an inner lining;

FIG. 6 is an explanatory figure;

FIG. 7 is an elevational view showing a rolling device, having grooved cylinders, and an end view showing a pre-shaped piece to be rolled;

DETAILED DESCRIPTION OF THE INVENTION

Figure 1:
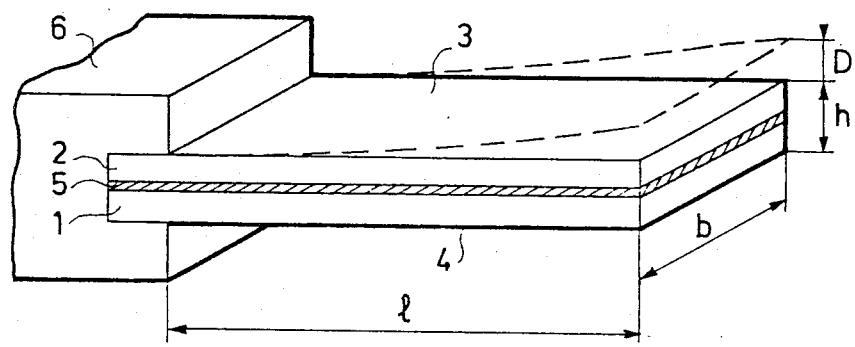
FIG. 1 is a perspective view showing a piezoelectric transducer.

FIG. 1 represents a piezoelectric transducer of the bimorph type, which is used in the form of a cantilevered beam, i.e. a beam one end of which is embedded. Said transducer is constituted by two blades 1 and 2 covered respectively with metallization layers 3 and 4, and an intermediary electrode 5 held between said two blades. One end of the transducer is embedded in a fixed socket 6. It can be shown that under the effect of a deflexion D resulting from a force F applied to the free end of the transducer a voltage V appears between electrodes 3 and 4 in an open circuit, such that:

$$V = \frac{3}{8} \cdot \frac{h^2}{l^2} \cdot \frac{d_{31}}{\epsilon} \cdot D$$

wherein
l is the free length of the transducer,
h is the thickness of the transducer,
$\epsilon$ is the dielectric constant of the polymeric substance, and
$d_{31}$ is the piezoelectric coefficient of said substance.

It can be shown furthermore that the deformation D' of such transducer under the action of a voltage V' applied between electrodes 3 and 4 in the absence of any mechanical stress corresponds to the formula:

$$D' = \frac{3}{2} \cdot \frac{l^2}{h^2} \cdot d_{31} \cdot V'$$

Bimorph polymer transducers, especially those made of polyvinylidene fluoride (PVF$_2$) are able to undergo very large deflexion under an applied field, and can generate very high voltages by flexion. With a view to profiting to the largest possible extent by these advantages, it is necessary to have at one's disposal materials having the highest piezoelectric coefficients $d_{31}$ possible, and to be able to bond the two films together with a minimum amount of adhesive. Such adhesive must have a Young modulus approximately equal to, or lower than, that of the polymer forming the blades, for reasons related to the mechanical reliability. It is furthermore desirable to use a production method which involves as little expense as possible. These conditions are met by the technology described herein-after, which is an essential object of the instant invention.

The use of an intermediary electrode made of polymeric material is based on several reasons. First of all, this electrode must be made to be bonded to the two bimorph blades. This is achieved all the more efficiently as the materials to be assembled have closely related respective properties. The intermediate electrode must furthermore be such that it is possible to draw it to an extent corresponding to several times its length, without any loss of its conductive properties.

The best solution consists in using an electrode of the same nature as that of the blades of the bimorph transducer, whereby satisfactory adherence is achieved under optimum conditions. It will be understood that during the rolling operation the problems raised by drawing the materials are minimized under these conditions. For example, the transducer may be made entirely of polyvinylidene fluoride (PVF$_2$), the intermediary electrode being rendered conductive by incorporating therein a convenient material. As regards the operation of such bimorph transducer, such electrode constitutes an ideal solution, since it is very thin and has mechanical properties substantially similar to those of the material forming the blades. Furthermore the conductivity of electrodes of this type is entirely sufficient for the requirements of polarization even when a low-cost carbon filler is used: 15% by weight of carbon of the type Corax L ® produced by the DEGUSSA Company will lead to a resistivity of about 10 $\Omega$.cm, which value is substantially below that of PVF$_2$ during rolling (resistivity equal to about $10^{12}$ $\Omega$.cm).

By way of example, but not of limitation, the description of the solution proposed herein-after concerns bimorphous transducers made entirely of polyvinylidene fluoride (PVF$_2$), this material constituting the blades as well as the intermediate electrode.

According to a first embodiment of the invention, the intermediary electrode is deposited in the form of a solution onto the blades to be assembled. A conductive PVF$_2$ solution may be obtained by using a solvent such as dimethyl formamide (DMF) in which the initial polymeric substance and carbon are dissolved. A solution presenting the following proportions:

DMF: 1 liter
PVF$_2$: 100 g
CORAX L ®: 20 g yields entirely satisfactory results. The solution is prepared at a temperature of about 80° to 90° C. under agitation during one hour. This solution is then deposited in the form of a thin layer on each one of those faces of the PVF$_2$ blades which are to constitute the inner faces of the bimorph transducers being produced. The conductive PVF$_2$ polymer present in the solution in dimethyl formamide causes, when deposited onto the blades, a superficial dissolution of the substrate blade to take place and thus ensures the formation of an adhering conductive deposited layer after evaporation of the dimethyl formamide. The PVF$_2$ blades may be produced by compression-moulding or extrusion of granules. The deposition is carried out at elevated temperature, the substrates and solutions being heated to about 60°–70° C. Thin, uniform layers having a thickness of about 15 to 20 microns may be produced by spraying by means of a paint spray pistol. Other methods, such as serigraphy, or deposition by means of a whirler may also be used.

Figure 2:
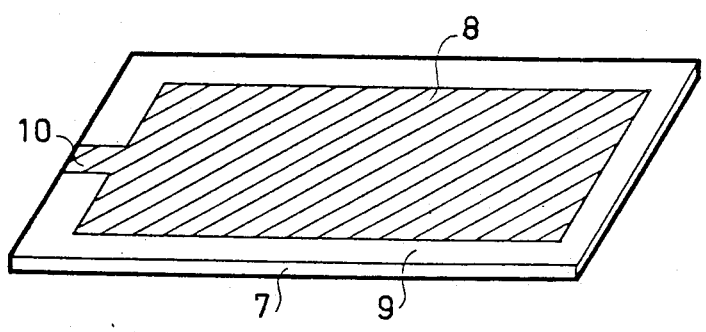
FIG. 2 shows a polymer blade on which an electrode in solution has been deposited.

FIG. 2 is a perspective view showing a polymer blade on which a conductive electrode in solution has been deposited. As shown, a blade 7 constitutes a substrate, and an electrode 8 has been deposited thereon in the form of a solution. A non-conductive margin 9 having a width of about 0.5 to 1 cm is provided on the films to be rolled, so as to avoid breakdown discharges in the air between the central electrode and the rolling cylinders during the rolling operation. Furthermore, the solution has also been deposited in a zone 10 so as to form a conductive lug constituting a contact member for connecting the electrode to an external circuit. About 10 minutes after depositing the electrodes it is considered that the evaporation of the solvent is sufficient, and the blades are pressed against each other while their respective electrodes engage one another and the respective zones 10 are facing each other. The pressing operation is carried out during some minutes at a temperature of about 100° C. and under a pressure of 10 kg/cm$^2$. Prior to the pressing operation a thin metallic foil is inserted between the electrodes, in the zone of mutual contact thereof, with a view to allowing the intermediate electrode to be connected to the polarizing voltage generator. When using this method of depositing the intermediary electrode and carrying out the consecutive pressing operation, an entirely satisfactory adhesion between the various components is obtained. The thus constituted assembly is then ready for rolling in the presence of an electric field, whereby the desired piezoelectric properties are conferred thereon.

Figure 3:
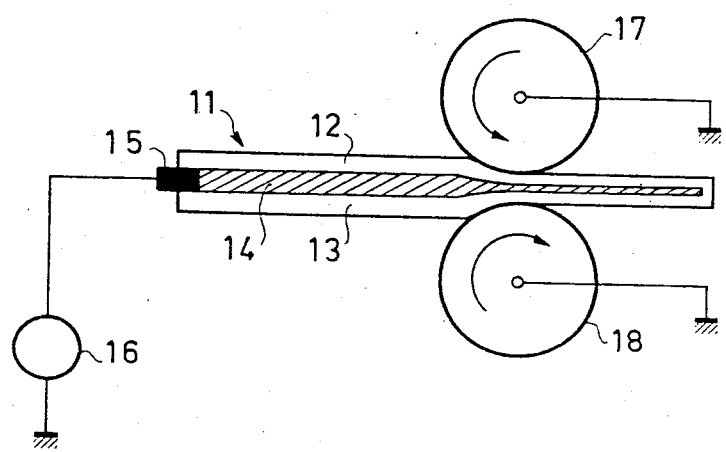
FIG. 3 shows a device for co-laminating in an electric field.

The co-laminating operation within an electric field may be carried out according to the technique illustrated in FIG. 3. In this Figure, reference numeral 11 designates the previously obtained product after pressing, constituted by polymer blades 12 and 13 and intermediate electrode 14. The Figure also shows a metallic foil 15 ensuring the electric connection between the intermediary electrode and an electric polarization generator 16. The assembly 11 passes through a rolling device (or rolling mill) constituted essentially by two conductive cylinders 17 and 18 which rotate in the direction indicated by the arrows. When remanent polarizations are to be obtained which are opposite to the intermediary electrode, the two rolling cylinders may be grounded, as indicated in FIG. 3.

The co-laminating (rolling) parameters may, for example, be as follows:
force acting between the cylinders: 40 to 100 tons;
advance speed of the workpiece: 1 to 10 mm/min.;
applied voltage: 10 to 20 kV;
starting thickness: 100 microns to 1 cm;
diameter of the cylinders: 8 cm;
stretching ratio: 3 to 4;
temperature of the cylinders: 50° to 80° C.

The piezoelectric coefficients obtained range from about 20 to $30 \times 10^{-12} CN^{-1}$. The system of mechanical stresses applied results in the fusion of the crystallites in non polar alpha phase, with subsequent complete recrystallization in beta phase under conditions of mechanical and electric orientation. For this reason the applied electric fields are moderate and the voltages to be applied are not closely dependent on the thickness of the bimorph transducer. Greater thickness and higher advance speeds may be envisaged, provided that cylinders having a greater diameter or dulled (roughened) surfaces are used.

With a view to conferring on such bimorph transducers properties of dimensional stability for long time periods and at temperatures higher than those at which they have been rolled (co-laminated), and with a view to ensuring a stable piezoelectric behavior of said transducers they are annealed while being submitted to mechanical stress parallel to the drawing axis, or in a press, at a temperature comprised between 100° and 110° C. during a time period comprised between 20 min and 1 hour. The subsequent shrinkage represents several % and the piezoelectric activity decreases by 10 to 30%, but stability is thus warranted for operating temperatures which may reach a value close to the annealing temperature.

The thus produced bimorph transducers are then metallized on one surface or on both surfaces by vaporizing aluminum or nickel-chrome. Another method consists either in depositing a polymer layer loaded with silver particles of the type DYNALOY 350 ® or, in a less expensive manner, especially in the case of captors which do not require highly conductive electrodes, in depositing $PVF_2$ polymer layer to which carbon black has been added, such layer being similar to the one used for forming the intermediate electrode.

Another embodiment of the invention consists in producing the intermediate electrode from polymer granules loaded with conductive carbon particles. $PVF_2$ polymer granules containing 20% by weight carbon are presently available. Starting from such granules it is possible to obtain films having a thickness of 100 microns or less, by using compression moulding or extrusion techniques. Such films can be drawn with a stretching (or drawing) ratio of substantially 400% without any loss of conductivity, which value meets the requirements of the co-laminating operation.

Figure 4:
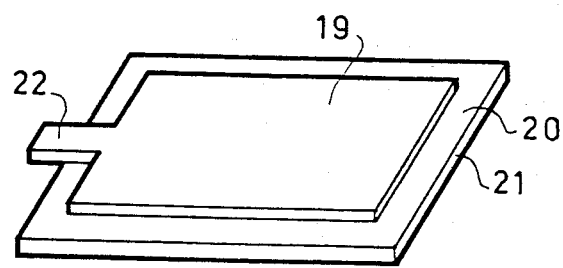
FIG. 4 shows a polymer blade and an intermediary electrode in the form of a film.

FIG. 4 shows the intermediate electrode 19 produced in such a manner that a non-conductive margin 20 subsists when said electrode is placed onto a polymer substrate 21 which can be constituted, for example, by $PVF_2$ polymer. The cutting also provides an electrical access to the electrode due to the provision of a lug 22 which protrudes over the substrate 21. A first polymer blade, the intermediary electrode and a second polymer blade are stacked, or superimposed, with a view to providing a bimorph structure. This assembly is then pressed at a temperature of about 165° C. during about 15 min. under a pressure of about 10 kg/cm². During this operation the assembly is placed between fixed blocks or the like having a thickness slightly smaller than that of the stacked layers, so as to avoid material flow. The pressing operation results in effectively welding to each other the three components of the bimorph structure which thus remains indestructible when being submitted to the rolling operation. This technique is simpler than the one previously described herein-above. However this technique is more particularly recommended when it is desired to produce comparatively thick bimorph transducers (thickness of several microns). Indeed it is difficult to obtain a uniform thickness of the electrode when the initial thickness thereof is smaller than 50 to 100 microns, which initial thickness may be reduced to about 12 to 25 microns by rolling (co-laminating). The co-laminating of the above-described structure may then be effected under the same conditions as those described herein previously.

The intermediate electrode of the bimorph transducer according to the invention may also be made of a polymer different from the one constituting the blades of said transducer.

The process of manufacturing a piezoelectric bimorph polymer transducer according to the present invention is advantageous in that it results in a product exhibiting outstanding mechanical and electrical properties. Such bimorph transducer may be used as an electro-acoustic emitter and/or captor.

The description herein-above relates to a structure formed by assembling polymer foils and bonding the same to each other by means of a conductive polymer adhesive which conserves the structure when the latter is submitted to co-laminating in the presence of an electric field. Such structure constitutes a pre-formed piece of all the components of which are able to undergo considerable elongation. It is also possible within the scope of the present invention to co-laminate (or roll) pre-formed pieces or structures of a different kind, in the presence of an electric field.

FIG. 5 above shows such a pre-formed piece. It is constituted by a tube 12 made of extruded polymer, the inner face of which is covered with a layer 14 of conductive polymer. Said inner layer 14 may be formed by coating or by co-extrusion with tube 12.

As shown in FIG. 6, the tube of FIG. 5 may be flattened between the plates 100 and 101 of a press. One advantage of such a pre-formed piece resides in the fact that the conductive material 14 is retained within the envelope 12. The rolling operation in the presence of an electric field may be effected, in the case of a structure of this kind, between two parallel cylinders having rectilinear generatrices.

The pre-shaped piece or structure may also have a coaxial circular section as shown in FIG. 7.

FIG. 7 shows a rolling device having grooved cylinders 102, 103 which are connected to the ground potential of a polarization voltage generator 104. The pre-shaped piece has the form of a cable of circular section the core 14 of which is made of conductive polymer and the envelope or sheath 12 of which is made of a polymer such as PVF$_2$. After a plurality of rolling steps, this pre-shaped piece will be transformed into a piezoelectric fibre with radial polarization. So as to achieve this result, the conductive core 14 is connected to the electric generator 104. The grooves 105, 106, 107, and 108 have toroidal shapes with a decreasing sectional area when the rolling is carried out by a succession of steps. It is also possible to use a plurality of rolling devices for rolling a plurality of pre-formed pieces simultaneously.

Figure 8:
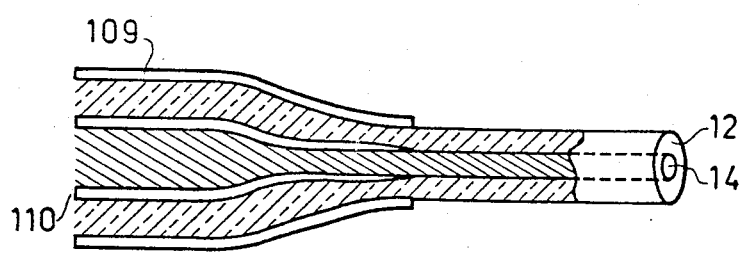
FIG. 8 illustrates the process of co-extruding a pre-shaped piece.
Figure 9:
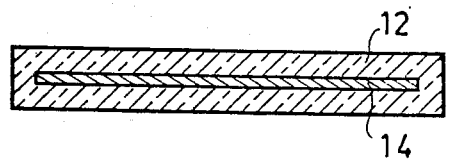
FIGS. 9, 10, and 11 are end views of pre-shaped pieces designed to be used for producing piezoelectric cables and tapes.
Figure 10:
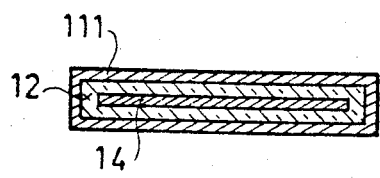
Figure 11:
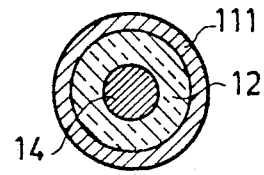

With a view to producing a pre-shaped piece or structure wherein the conductive electrode forms the core of a cable, it is advantageous to use the co-extrusion technique illustrated in FIG. 8. The polymer 12 and the conductive polymer 14 are injected at elevated temperature into coaxial dies 109 and 110. This method enables one to obtain directly the structures shown in FIGS. 9, 10 and 11. Reference numeral 111 in FIGS. 10 and 11 designates a conductive polymer sheath which can be formed by co-extrusion or by immersion.

When the pre-shaped piece has a circular coaxial section the polarization effected during the rolling operation is a radial polarization.

The invention is not limited to the embodiments shown and described herein-above; many modifications and variants may be envisaged by those skilled in the art without departing from the spirit and scope of the invention as defined in the appended claims.

What is claimed is:

1. A method of manufacturing a composite piezeoelectric transducer comprising the steps of:
    forming two blades made of a first polymeric sbustance;
    forming a solution including a solvent in which a second polymeric substance and carbon are dissolved;
    depositing said solution in the form of a thin layer on faces of each one of said two blades;
    evaporating the solvent from said two blades after depositing of said solution thereon, thereby causing a superficial dissolution of the substrate blades to take place ensuring the formation of the adhering conductive electrode layer;
    pressing said two blades against each other while their respective electrodes engage one another to form an assembly; and
    rolling said assembly between two rollers in the presence of an electric field, said rolling step applying a force acting between the two rollers ranging from 40 to 100 tons, said electric field ranging from 10 to 20 kV, asnd the temperature of the two rollers ranging from 50° C. to 80° C.

2. A method as claimed in claim 1 further including the step of inserting a metal foil between the electrodes prior to said pressing step.

3. A method as claimed in claim 1 wherein said solution depositing step leaves a non-conductive outermargin, having a width range from 0.5 cm to 1 cm, at substantially the enitre periphery of said two blades, except in a small zone wherein a conductive lug is formed.

4. A method as claimed in claim 1 wherein said blade forming step is carried out by compression-molding.

5. A method as claimed in claim 1 wherein said blade forming step is carried out by extrusion.

6. A method as claimed in claim 1 wherein said solution is prepared at a temperature ranging from 80° C. to 90° C. while said solution is being agitated for approximately one hour.

7. A method as claimed in claim 1 wherein said solvent comrpises dimethylformamide.

8. A method as claimed in claim 1 wherein said solution depositing step is carried out at a temperature ranging from 60° C. to 70° C.

9. A method as claimed in claim 1, wherein said first and second polymeric substances are polyvinylidene fluoride.

10. A method as claimed in claim 1, wherein said pressing step is carried out at a temperature of substantially 100° C., under a pressure of sbustantially 10 kg/cm$^2$ for several minutes.

11. A method of manufacturing a composite piezoelectric transducer comprising the steps of:
    forming a tube of an extruded first polymeric substance;
    forming a solution including a solvent in which a second polymeric substance and carbon are dissolved;
    coating an inner surface of said tube with said solution;
    evaporating the solvent from said tube after said coating step, thereby causing a superficial dissolution of the tube to take place ensuring the formation of an adhering conductive electrode coating;
    flattening said tube by pressing it between plates of a press; and
    rolling the flattened tube in the presence of an electric field.

12. A method as claimed in claim 11, wherein said coating step comprises filling the entire inner cavity of said tube.

* * * * *